(12) United States Patent
Alberkrack et al.

(10) Patent No.: US 7,667,512 B2
(45) Date of Patent: Feb. 23, 2010

(54) DUTY CYCLE COMPARATOR

(75) Inventors: Jade H. Alberkrack, Tempe, AZ (US);
Robert Alan Brannen, Chandler, AZ (US)

(73) Assignee: Standard Microsystems Corporation, Haupdage, NY (US)

( * ) Notice: Subject to any disclaimer, the term of this patent is extended or adjusted under 35 U.S.C. 154(b) by 0 days.

(21) Appl. No.: 11/730,000

(22) Filed: Mar. 29, 2007

(65) Prior Publication Data
US 2008/0238487 A1    Oct. 2, 2008

(51) Int. Cl.
*H03K 3/017* (2006.01)
(52) U.S. Cl. .......................... 327/172; 327/175
(58) Field of Classification Search ............... None
See application file for complete search history.

(56) References Cited
U.S. PATENT DOCUMENTS

| | | | |
|---|---|---|---|
| 5,502,419 A * | 3/1996 | Kawasaki et al. ........... 332/109 |
| 5,710,697 A * | 1/1998 | Cooke et al. ............. 363/21.11 |
| 5,990,753 A * | 11/1999 | Danstrom et al. ........... 331/143 |
| 6,384,652 B1 * | 5/2002 | Shu ............... 327/175 |
| 6,445,258 B1 * | 9/2002 | Truong ............... 331/158 |
| 6,578,154 B1 * | 6/2003 | Wynen et al. ............. 713/500 |
| 6,727,832 B1 * | 4/2004 | Melanson ............ 341/143 |
| 6,943,604 B2 * | 9/2005 | Minzoni ............... 327/175 |
| 6,975,100 B2 * | 12/2005 | Doppke et al. ............ 323/288 |
| 7,307,461 B2 * | 12/2007 | Nguyen et al. ............. 327/172 |
| 2005/0270008 A1 * | 12/2005 | Kuo ............... 323/288 |
| 2006/0197569 A1 * | 9/2006 | Capodivacca et al. ........ 327/175 |

* cited by examiner

*Primary Examiner*—Cassandra Cox
(74) *Attorney, Agent, or Firm*—Donald J Lenkszus

(57) ABSTRACT

A duty cycle comparator is described for comparing the duty cycles of two digital signals. The duty cycle comparator comprises a first controllable current source, a second controllable current source and a charge accumulation device. The comparator provides an output signal that is representative of the difference between the duty cycles independent of the frequency of the two digital signals.

24 Claims, 5 Drawing Sheets

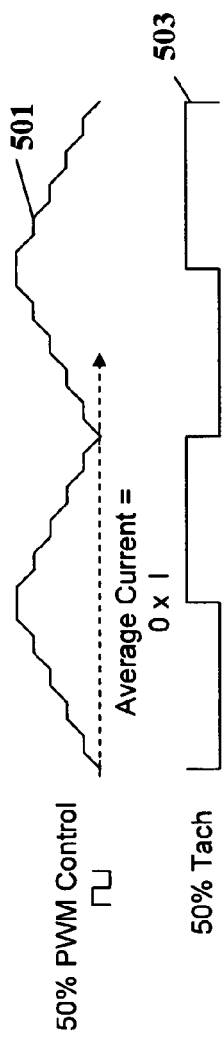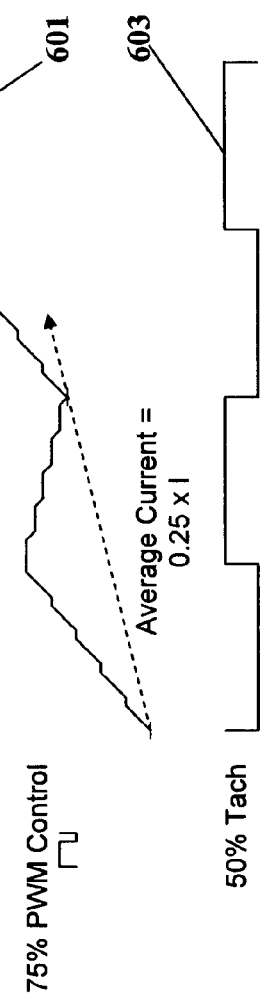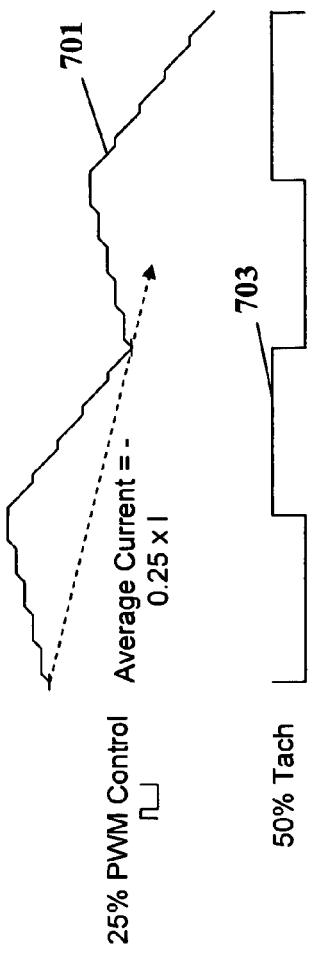
FIG. 5
FIG. 6
FIG. 7

901 receiving first digital signals having a first duty cycle;

903 receiving second digital signals having a second duty cycle;

905 providing a charge accumulation device;

907 controlling a first controlled current source with the first digital signals to charge the charge accumulation device;

909 controlling a second controlled current source with the second digital signals to discharge the charge accumulation device;

911 using the charge on the charge accumulation device to produce an output signal representative of the difference in duty cycles of the first digital signals and the second digital signals.

FIG. 9

DUTY CYCLE COMPARATOR

FIELD OF THE INVENTION

The invention pertains to a duty cycle comparator to compare the duty cycles of two digital waveforms

SUMMARY OF THE INVENTION

In accordance with the principles of the invention a duty cycle comparator has a first input coupled to a first node and a second input coupled to a second node to generate an output signal that represents the difference in the duty cycles.

Further in accordance with the principles of the invention, the duty cycle comparator comprises a first controlled current source having a control input coupled to the first node, a second controlled current source having a control input coupled the second node, and a charge accumulation device coupled to the first and second controlled current sources and to the first output node to generate the control signal. In the illustrative embodiment of the invention, the charge accumulation device is a capacitor.

BRIEF DESCRIPTION OF THE DRAWING

The invention will be better understood from a reading of the following detailed description of the drawing in which like reference designators are used to identify like elements in the various drawing figures, and in which:

FIGS. 5, 6, and 7 are waveforms showing the operation of the duty cycle comparator of FIG. 4;

FIG. 9 illustrates steps in comparing duty cycles in accordance with the principles of the invention.

DETAILED DESCRIPTION

Figure 1:
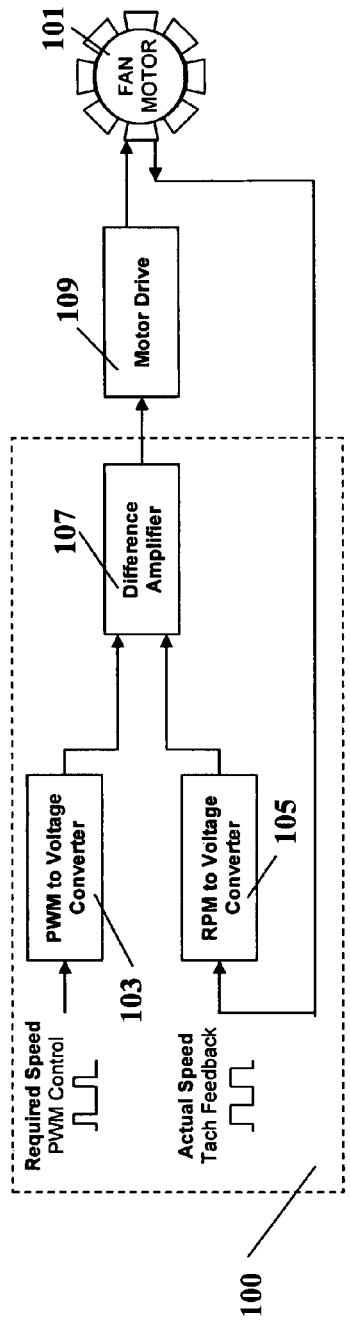
FIG. 1 is block diagram of a prior art motor controller and fan.

FIG. 1 illustrates a prior art closed loop voltage comparison type controller 100 and drive arrangement 109 for controlling the speed of a DC motor 101 that is utilized as part of a cooling fan assembly of a computer which is not shown. An input PWM (Pulse Width Modulated) signal that indicates the desired fan or motor speed is provided to a PWM-to-voltage converter 103. Converter 103 generates an output voltage that is representative of the desired fan speed.

DC motor 101 provides an output signal TACH that is indicative of the actual rotational speed of DC motor 101. This actual speed signal TACH is converted to a voltage representative of the actual motor speed by an RPM-to-voltage converter circuit 105.

PWM-to-voltage converter 103 provides an analog voltage that is proportional to the desired or required speed of motor 101. RPM-to-voltage converter 105 provides an analog voltage that is proportional to the actual speed of motor 101.

The voltage outputs of voltage converter 103 and voltage converter 105 are both applied to the inputs of a difference amplifier 107 which in turn generates a control loop error voltage that is used to control a motor drive circuit 109 utilized to drive DC motor 101.

Figure 2:
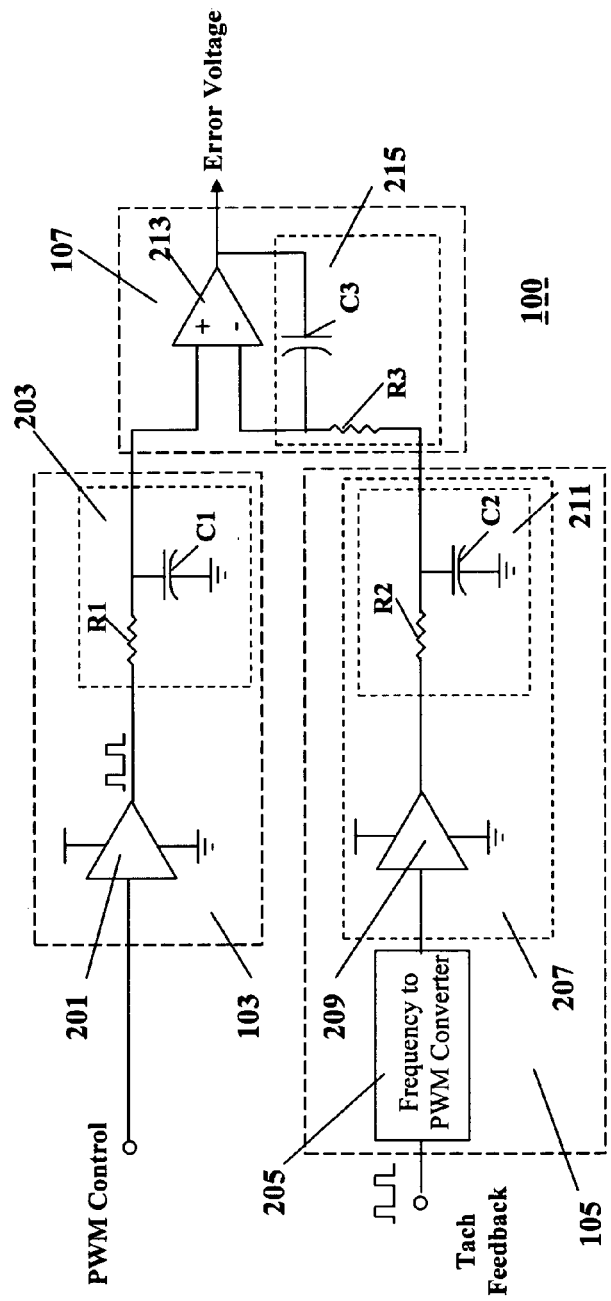
FIG. 2 illustrates a portion of the prior art motor controller of FIG. 1 in greater detail.

FIG. 2 illustrates controller 100 in greater detail. Converter 103 includes a buffer 201 and low pass filter 203 comprising resistor R1 and capacitor C1. Converter 105 includes frequency-to-PWM converter circuit 205 and PWM-to-voltage converter 207. Converter 205 receives the speed signal from fan motor 101 and generates a PWM signal in dependence on the frequency of the motor speed signal. The PWM output of converter 205 is applied to a second PWM-to-voltage converter 207. Converter 207 includes a buffer amplifier 209 and a low pass filter 211 comprising resistor R2 and capacitor C2. Difference amplifier 107 includes a difference amplifier circuit 213 and a low pass filter 215 comprising resistor R3 and capacitor C3.

The prior art closed loop voltage comparison type controller 100 is an analog closed loop arrangement. There are several problems with this type of arrangement that are of particular concern in providing an integrated controller. More specifically, the closed loop voltage comparison type controller 100 requires that the Vdd supply voltage level to PWM-to-voltage converter 103 and PWM-to-voltage converter 207 be regulated; the use of three capacitors C1, C2, C3 that add cost; and the use of a difference amplifier 213 to produce a speed error or correction signal.

Figure 3:
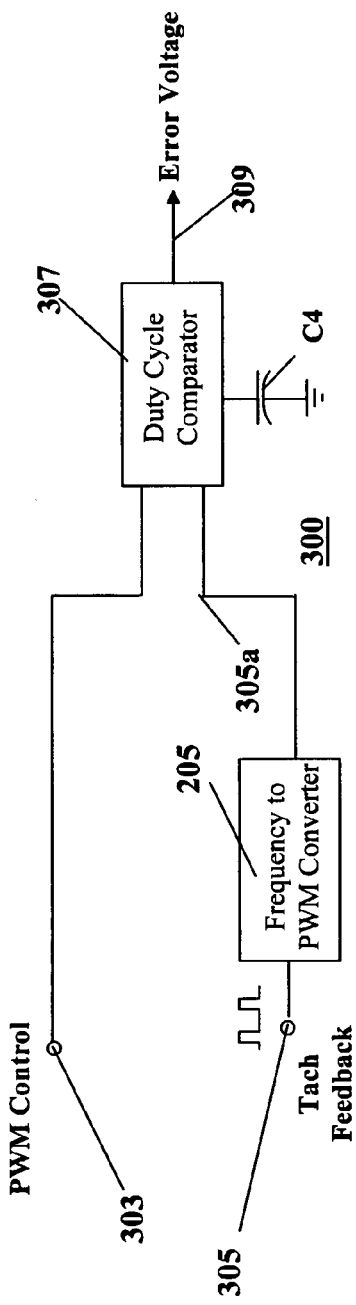
FIG. 3 is a diagram of a portion of a motor controller utilizing a duty cycle comparator in accordance with the principles of the invention.

Turning now to FIG. 3, an improved closed loop motor controller 300 is shown in block diagram form. Controller 300 receives a PWM control signal corresponding to a desired motor speed at a first input 303. The duty cycle of the PWM control signal at first input 303 is proportional to the desired or required speed of the motor.

A tachometer feedback signal from the motor is received at terminal 305. This signal varies in frequency in proportion to the speed of the motor. The tachometer feedback signals are coupled to the input of a frequency-to-PWM converter circuit 205. Frequency-to-PWM converter circuit 205 provides an output pulse train that has a duty cycle proportional to the actual speed of the motor. A duty cycle comparator circuit 307 has a first input coupled to the PWM control input terminal 303 and a second input coupled to the output of the frequency-to PWM converter circuit 205. Duty cycle comparator 307 compares the duty cycles of the signals at its two inputs and generates a control loop error voltage signal at its output 309 to the motor drive circuit.

Figure 4:
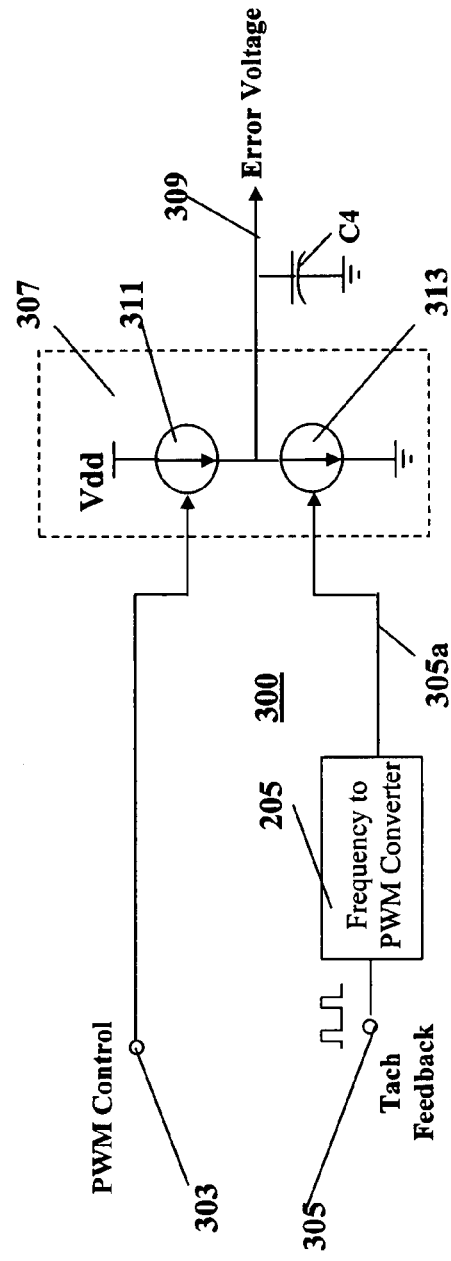
FIG. 4 illustrates the duty cycle comparator of the controller of FIG. 3 in greater detail.

Turning now to FIG. 4, details of duty cycle comparator 307 are shown. Duty cycle comparator 307 includes a first controllable current source 311 and a second controllable current source 313 both of which are coupled to capacitor C4. Capacitor C4 is a low pass filter that provides charge accumulation/error integration. Current source 311 is controlled by a PWM control signal and charges capacitor C4 when the PWM control signal is in a high state. Current source 313 is controlled by the output signal of the frequency-to-PWM converter 205 and discharges capacitor C4 in proportion to the actual motor speed. Capacitor C4 acts as a charge accumulator.

FIGS. 5, 6, and 7 illustrate operation of the duty cycle comparator 307. In each of the FIGS. 5, 6, and 7, it is assumed that current sources 311, 313 both supply identical current levels, I, such that current source 311 charges capacitor C4 with a current I and current source 313 discharges capacitor C4 with current I. It is also assumed that the PWM control signal is at a higher frequency than the tachometer feedback signal. The tachometer feedback signal is adjusted such that the duty cycle of the tachometer feedback signal, 305a is 50% when the motor is running at 50% of its maximum speed.

Turning to FIG. 5, waveform 501 represents the voltage across capacitor C4, under the conditions that the desired motor speed is at 50% of maximum speed and the motor is operating at 50% of its maximum speed. The tachometer feedback signal is at a 50% duty cycle corresponding to half speed as shown by waveform 503. Under these conditions, the average charge and discharge current flows to capacitor C4 are equal and the voltage across capacitor C4 is at equilibrium.

Turning to FIG. 6, waveform 601 represents the voltage across capacitor C4, under the conditions that the desired motor speed is at 75% of maximum speed and the motor is operating at 50% of its maximum speed. The tachometer feedback signal is at a 50% duty cycle corresponding to half speed as shown by waveform 603. Under these conditions, the average current flow to capacitor C4 is 0.25×I, and the voltage across capacitor C4 rises until the motor speeds up to the desired speed.

Turning to FIG. 7, waveform 701 represents the voltage across capacitor C4, under the conditions that the desired motor speed is at 25% of maximum speed and the motor is operating at 50% of its maximum speed. The tachometer feedback signal is at a 50% duty cycle corresponding to half speed as shown by waveform 703. Under these conditions, the average current from capacitor C4 is 0.25×I, and the voltage across capacitor C4 falls until the motor slows to the desired speed.

There are significant advantages to utilizing duty cycle comparator 307. One such advantage is that the supply voltage Vdd does not need to be regulated because current sources are utilized. In addition, only one filter capacitor C4 is utilized thereby saving component cost. A difference amplifier is also not required because filter capacitor C4 automatically provides the error voltage. Still further, the charge and discharge currents do not need to be exact, but only ratio metric.

Figure 8:
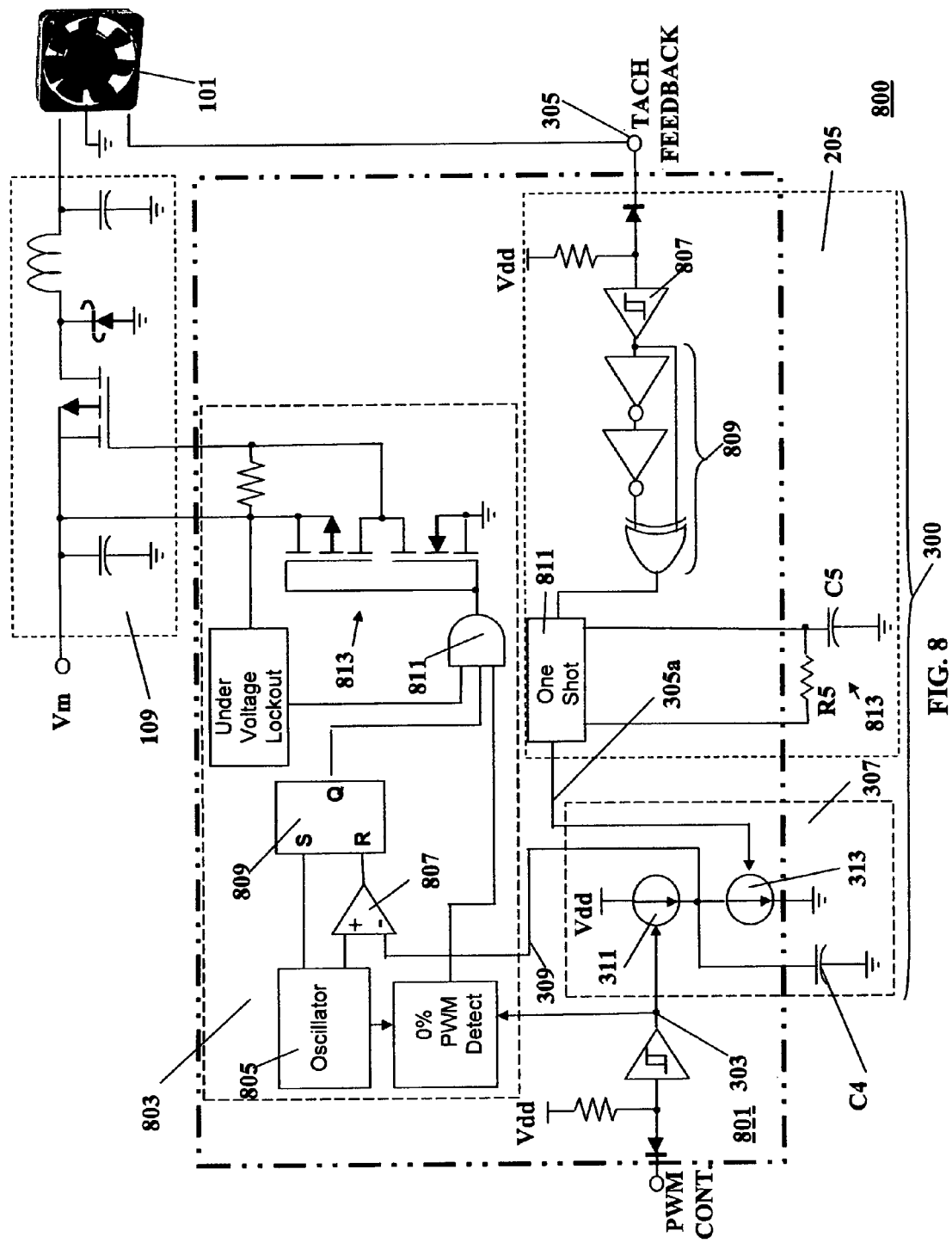
FIG. 8 is a more detailed diagram of a motor controller in accordance with the principles of the invention.

A controller 800, integrated on a single chip 801 contains all required functions for implementing fan speed control. As shown in FIG. 8, the motor controller of the invention comprising a frequency-to-PWM converter circuit 205 coupled to the tachometer feedback signal and to a duty cycle comparator 307 integrated onto a substrate 801. Frequency to PWM converter circuit 205 includes a buffer circuit 807 coupled to the tachometer feedback terminal and edge detector 809. Edge detector 809 drives one shot circuit 811. A timing circuit 813, coupled to one shot circuit 811, comprises resistor R5 and capacitor C5. The values of resistor R5 and capacitor C5 are selected for the maximum motor speed at 100% PWM signals.

Controller 800 also includes a pulse width modulator 803 integrated on substrate 801. Pulse width modulator 803 comprises a fixed frequency oscillator 805 that provides a pulse output and a saw tooth output, comparator 807, and a latch 809 along with associated gates 811 for motor speed control of motor 101. Controller 800 also includes driver circuit 813 integrated onto substrate 801 for driving an external switch transistor.

In other embodiments of the invention, controller 300 may be integrated onto the same silicon substrate or chip as the device being cooled by fan 101, such as Onto a microprocessor substrate.

Duty cycle comparator 307 comprises a first input 303 to receive a first digital signal having a first duty cycle and a second input 305a to receive a second digital signal having a second duty cycle. A first controlled current source 311 has a control input coupled to the first input 303. A second controlled current source 313 has a control input coupled the second input 305a. A charge accumulation device or capacitor C4 is coupled to the first and second controlled current sources 311, 313. The first controlled current source 311 increases the charge accumulated by charge accumulation device or capacitor C4 in response to the first digital signal. The second controlled current source 313 decreases the charge accumulated by the charge accumulation device or capacitor C4 in response to the second digital signal. Charge accumulation device produces an output signal voltage at output 309 that is representative of the difference in duty cycles of the first digital signal and the second digital signal.

In the embodiment of the invention, the first digital signal is at a first frequency and the second digital signal is at a second frequency different from the first frequency. More specifically, the first frequency is higher than the said frequency. However, in other embodiments, the first and second frequencies may be equal or the first frequency may be lower than the second frequency.

The output signal produced by the charge accumulation device or capacitor C4 is an analog voltage signal.

In accordance with an aspect of the invention, the embodiment provides a method of comparing duty cycles of two digital signals as shown in FIG. 9. The method comprises the steps of:

receiving a first digital signal having a first duty cycle, 901;

receiving a second digital signal having a second duty cycle, 903;

providing a charge accumulation device, 905;

controlling a first controlled current source with the first digital signal to charge the charge accumulation device, 907;

controlling a second controlled current source with the second digital signal to discharge the charge accumulation device, 909; and using the charge on the charge accumulation device to produce an output signal representative of the difference in duty cycles of the first digital signal and the second digital signal, 911.

It will be understood by those skilled in the art that the term "current source" as utilized herein includes current sources and current sinks. It will also be understood by those skilled in the art that many different implementations for current sources exist and that the invention is not dependent upon any specific implementation of a current source. It will also be understood by those skilled in the art that signal inputs 303 and 305a can be interchanged so that a decrease in the output voltage increases the motor speed.

The invention has been described in conjunction with a specific illustrative embodiment. It will be understood by those skilled in the art that various changes, substitutions and modifications may be made without departing from the spirit or scope of the invention. It is intended that all such changes, substitutions and modifications be included in the scope of the invention. It is not intended that the invention be limited to the illustrative embodiment shown and described herein. It is intended that the invention be limited only by the claims appended hereto, giving the claims the broadest possible scope and coverage permitted under the law.

What is claimed is:

1. A duty cycle comparator, comprising:

a first input to receive a first digital signal having a first duty cycle;

a second input to receive a second digital signal having a second duty cycle, said second digital signal not having a direct relationship to said first digital signal;

a first controlled current source having a control input coupled to said first input; a second controlled current source having a control input coupled said second input; and a charge accumulation device coupled to said first and second controlled current sources, said first controlled current source changing in a first direction the charge accumulated by said charge accumulation device in response to said first digital signal, said second controlled current source changing in a direction opposite to said first direction the charge accumulated by said charge accumulation device in response to said second digital signal, said charge accumulation device producing an output signal representative of the difference in duty cycles of said first digital signal and said second digital signal.

2. A duty cycle comparator in accordance with claim 1, wherein:

said charge accumulation device comprises a capacitor.

3. A duty cycle comparator in accordance with claim 2, wherein:

said first digital signal is at a first frequency and said second digital signal is at a second frequency different from said first frequency.

4. A duty cycle comparator in accordance with claim 3, wherein:

said first frequency is higher than said second frequency.

5. A duty cycle comparator in accordance with claim 4, wherein:

said first digital signal is a PWM signal and said second digital signal is a PWM signal.

6. A duty cycle comparator in accordance with claim 5, wherein:

said output signal is an analog voltage signal.

7. A duty cycle comparator in accordance with claim 1, wherein:

said first digital signal is at a first frequency and said second digital signal is at a second frequency different from said first frequency.

8. A duty cycle comparator in accordance with claim 7, wherein:

said first frequency is higher than said second frequency.

9. A duty cycle comparator in accordance with claim 8, wherein:

said first digital signal is a PWM signals and said second digital signal is a PWM signal.

10. A duty cycle comparator in accordance with claim 9, wherein:

said output signal is an analog voltage signal.

11. A duty cycle comparator in accordance with claim 1, wherein:

said charge accumulation device produces said output signal representative of the difference in duty cycles of said first digital signal and said second digital signal independent of the frequencies of the first digital signal and the second digital signal.

12. A method of comparing duty cycles of two digital signals, said method comprising:

receiving a first digital signal having a first duty cycle;

receiving second digital signal having a second duty cycle, said second digital signal nor having a direct relationship to said first digital signal;

providing a charge accumulation device;

controlling a first controlled current source with said first digital signal to change, in a first direction, the charge accumulated by said charge accumulation device;

controlling a second controlled current source with said second digital signal to change, in a second direction opposite to said first direction said charge accumulated by said accumulation device;

using the charge on said charge accumulation device to produce an output signal representative of the difference in duty cycles of said first digital signal and said second digital signal.

13. A method in accordance with claim 12, comprising:

utilizing a capacitor as said charge accumulation device.

14. A method in accordance with claim 13, comprising:

providing said first digital signal at a first frequency; and providing said second digital signal at a second frequency different from said first frequency.

15. A method in accordance with claim 13, comprising:

providing said first digital signal at a first frequency; and providing said second digital signal at a second frequency different from and lower than said first frequency.

16. A method in accordance with claim 15, comprising:

providing said first digital signal as a PWM signal; and providing said second digital signal as a PWM signal.

17. A method in accordance with claim 16, comprising:

providing said output signal is an analog voltage signal.

18. A method in accordance with claim 13, comprising:

providing said first digital signal as a PWM signal; and providing said second digital signal as a PWM signal.

19. A method in accordance with claim 12, comprising:

providing said first digital signal at a first frequency; and providing said second digital signal at a second frequency different from said first frequency.

20. A method in accordance with claim 19, wherein:

said first frequency is higher than said second frequency.

21. A method in accordance with claim 20, comprising:

providing said first digital signal as a PWM signal; and providing said second digital signal as a PWM signal.

22. A method in accordance with claim 12, comprising:

providing said first digital signal as a PWM signal; and providing said second digital signal as a PWM signal.

23. A method in accordance with claim 12, comprising:

using the charge on said charge accumulation device to produce an output signal representative of the difference in duty cycles of said first digital signal and said second digital signal, independent of the frequencies of the first digital signal and the second digital signal.

24. A method of comparing duty cycles of two digital signals, said method comprising:

receiving a first digital signal having a first duty cycle;

receiving a second digital signal having a second duty cycle, said second digital signal not having a direct relationship to said first digital signal;

providing a charge accumulation device;

controlling a first controlled current source with said first digital signal to charge said charge accumulation device;

controlling a second controlled current source with said second digital signal to discharge said charge accumulation device;

using the charge on said charge accumulation device to produce an output signal representative of the difference in duty cycles of said first digital signal and said second digital signal, independent of the frequencies of the first digital signal and the second digital signal.

* * * * *